United States Patent
Iida et al.

(10) Patent No.: US 6,364,947 B1
(45) Date of Patent: Apr. 2, 2002

(54) METHOD AND APPARATUS FOR MANUFACTURING A SILICON SINGLE CRYSTAL HAVING FEW CRYSTAL DEFECTS, AND A SILICON SINGLE CRYSTAL AND SILICON WAFERS MANUFACTURED BY THE SAME

(75) Inventors: Makoto Iida; Eiichi Iino; Masanori Kimura; Shozo Muraoka, all of Gunma-ken; Hideki Yamanaka, Fukushima-ken, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/661,985

(22) Filed: Sep. 14, 2000

Related U.S. Application Data

(62) Division of application No. 09/359,078, filed on Jul. 22, 1999, now Pat. No. 6,159,438, which is a division of application No. 09/109,530, filed on Jul. 2, 1998, now Pat. No. 5,968,264.

(30) Foreign Application Priority Data

Jul. 9, 1997 (JP) .............................................. 9-199415
Mar. 9, 1998 (JP) .............................................. 10-74866

(51) Int. Cl.$^7$ .............................................. C30B 15/00
(52) U.S. Cl. ...................... 117/206; 117/217; 117/220; 117/222
(58) Field of Search ............................. 117/13, 32, 208, 117/220, 222, 206, 217

(56) References Cited

U.S. PATENT DOCUMENTS

| | | | |
|---|---|---|---|
| 5,373,805 A | 12/1994 | Takano et al. | 117/18 |
| 5,779,791 A | 7/1998 | Korbe et al. | 117/15 |
| 5,827,366 A | 10/1998 | Watanabe | 117/202 |
| 5,968,264 A | 10/1999 | Iida et al. | 117/30 |

FOREIGN PATENT DOCUMENTS

| | | |
|---|---|---|
| EP | 0732427 | 3/1956 |
| EP | 0392210 | 3/1990 |
| EP | 866150 | 9/1998 |

(List continued on next page.)

OTHER PUBLICATIONS

Dupret et al., "Global Modeling of Heat Transfer in Crystal Growth Furnaces"; *Int. J. Heat Mass Transfer*, vol. 33, No. 9 (1990) pp. 1849–1871, XP000577560 Oxford, GB.

Abe et al., "Swirl Defects in Float–Zoned Silicon Crystals," *Physica*, 116B (1983) 139–174.

Dornberger et al., "The Dependence of Ring–Like Distributed Stacking Faults on the Axial Temperature Gradient of Growing Czochralski Silicon Crystals," *J. Electrochem. Soc.*, vol. 143, No. 5, May 1996.

*Primary Examiner*—William A. Powell
(74) *Attorney, Agent, or Firm*—Hogan & Hartson, L.L.P.

(57) ABSTRACT

In method for manufacturing a silicon single crystal in accordance with a Czochralski method, during the growth of the silicon single crystal, pulling is performed such that a solid-liquid interface in the crystal, excluding a peripheral 5 mm-width portion, exists within a range of an average vertical position of the solid-liquid interface ±5 mm. There is also disclosed a method for manufacturing a silicon single crystal in accordance with the Czochralski method, wherein during the growth of a silicon single crystal, a furnace temperature is controlled such that a temperature gradient difference $\Delta G$ (=Ge−Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal. The method maintains high productivity and enables a silicon single crystal and silicon wafers to be manufactured such that a defect density is very low over the entire crystal cross section, and the oxygen concentration distribution over the surface of each silicon wafer is improved.

2 Claims, 8 Drawing Sheets

FOREIGN PATENT DOCUMENTS

| | | |
|---|---|---|
| GB | 2163367 | 2/1986 |
| JP | 4016589 | 1/1992 |
| JP | 5085881 | 4/1993 |
| JP | 5330975 | 12/1993 |
| JP | 7257991 | 10/1995 |
| JP | 8012493 | 1/1996 |
| JP | 8268794 | 10/1996 |
| JP | 8330316 | 12/1996 |
| WO | 9218672 | 10/1992 |
| WO | 9721853 | 6/1997 |

METHOD AND APPARATUS FOR MANUFACTURING A SILICON SINGLE CRYSTAL HAVING FEW CRYSTAL DEFECTS, AND A SILICON SINGLE CRYSTAL AND SILICON WAFERS MANUFACTURED BY THE SAME

This is a divisional of application Ser. No. 09/359,078 filed Jul. 22, 1999, now U.S. Pat. No. 6,159,438, which in turn is a divisional of application Ser. No. 09/109,530 filed Jul. 2, 1998, now U.S. Pat. No. 5,968,264, which applications are hereby incorporated by reference in their entirety.

BACKGROUND OF THE INVENTION

1. Field of the Invention

The present invention relates to a method and an apparatus for manufacturing a silicon single crystal having few crystal defects and a uniform oxygen concentration distribution, as well as to a silicon single crystal and silicon wafers manufactured by the same.

2. Description of the Related Art

Along with a decrease in size of semiconductor elements for coping with the increased degree of integration of semiconductor circuits, quality requirements are recently becoming severer on silicon single crystals which are grown by the Czochralski method (hereinafter referred to as the CZ method) for use as materials for substrates of semiconductor circuits. Particularly, there has been required a reduction in density and size of grown-in defects such as flow pattern defects (FPD), laser scattering tomography defects (LSTD), and crystal originated particles (COP).

In connection with the description of the above-mentioned defects incorporated into a silicon single crystal, first are described factors which determine the concentration of a point defect called a vacancy (hereinafter may be referred to as V) and the concentration of a point defect called interstitial (hereinafter may be referred to as I) silicon.

In a silicon single crystal, a V region refers to a region which contains a relatively large number of vacancies, i.e., depressions, pits, or the like caused by missing silicon atoms; and an I region refers to a region which contains a relatively large number of dislocations caused by excess silicon atoms or a relatively large number of clusters of excess silicon atoms. Further, between the V region and the I region there exists a neutral (hereinafter may be referred to as N) region which contains no or few missing or excess silicon atoms. Recent studies have revealed that the above-mentioned grown-in defects such as FPD, LSTD, and COP are generated only when vacancies and/or interstitials are present in a supersaturated state and that even when some atoms deviate from their ideal positions, they do not appear as a defect so long as vacancies and/or interstitials do not exceed the saturation level.

According to a popular view, in the CZ method, the concentration of vacancies and/or interstitials depends on the relation between the pulling rate of crystal and the temperature gradient G in the vicinity of a solid-liquid interface of a growing crystal (see FIG. 4), and another type of defect called oxidation-induced stacking fault (OSF) is present in the vicinity of the boundary between the V region and the I region (Erich Dornberger and Wilfred von Ammon, J. Electrochem. Soc., Vol. 143, No. 5, May 1996; T. Abe, H. Harada, J. Chikawa, Paper presented at ICDS-12 Amsterdam, Aug. 31–Sep. 3, 1982).

According to a conventional pulling method, in view of cost of growth and assuming that OSF does not exist in a V-rich region, pulling is mostly performed in the V-rich region, in which a crystal can be grown at a relatively high growth rate. Also, a thermal history or the like during pulling has been controlled so as to reduce crystal defects generated in the V-rich region. For example, according to control practiced in the conventional pulling method, a transit time across a temperature zone of 1150–1080° C. is made relatively long so as to reduce the density of defects, each of which is conceivably a cluster of vacancies such as FPD, so that there can be improved the dielectric breakdown strength of oxide film, which is a factor for evaluating device characteristics. However, recent studies have revealed that such a method as controlling a thermal history (a transit time across a certain temperature zone) during pulling can reduce the density of defects, but the size of defects rather increases with a resultant failure to reduce a total volume of defects.

Thus, there has recently been made an attempt to reduce the pulling rate for quality improvement in spite of an increase in manufacturing cost or to increase a temperature gradient in the vicinity of the solid-liquid interface of a crystal as much as possible, to thereby manufacture a crystal that partially or entirely has an I-rich region, in which FPD, LSTD, COP, and like defects are observed less often. However, recent studies have revealed that even in the I-rich region, relatively large-sized Secco etch pit defects (hereinafter referred to as L-SEPD) are present at a portion located away from the boundary region between the V-rich region and the I-rich region. L-SEPD is conceivably a dislocation loop formed of a cluster of excess interstitial silicons. L-SEPD may be more likely to have an adverse effect on device characteristics than are FPD, LSTD, COP, and like defects generated in the V-rich region.

A recent tendency to increase the degree of integration of semiconductor devices requires uniformity of properties over a silicon wafer surface. Particularly, the oxygen concentration distribution is desired to be uniformly distributed over the surface of a wafer since the distribution directly influences the yield of devices.

Conceivable factors responsible for an impairment in the oxygen concentration distribution over the surface of a silicon wafer obtained from a crystal grown by the CZ method include convection of silicon melt, conditions of a gas atmosphere, rotation of a crystal, and rotation of a crucible. Particularly, since a cooling rate differs between an outer peripheral portion and an inner central portion of a growing crystal ingot, a crystal growth interface (a solid-liquid interface) does not become flat, thus having an adverse effect on the oxygen concentration distribution over the surface of a wafer.

Specifically, in the CZ method, at an inner portion of a crystal growth interface, crystal growth is relatively slow because of relatively slow cooling. As a result, the crystal growth interface becomes upwardly convex. A wafer obtained by slicing the thus-grown silicon bar has growth striations on the surface derived from different times of growth. Consequently, an oxygen concentration is distributed over the wafer surface in accordance with variations in oxygen concentration in the direction of crystal growth.

Conventionally, such variations and distribution of oxygen concentration derived from the profile of a solid-liquid interface are considered unavoidable in growing a single-crystal ingot by the CZ method.

Accordingly, taking for granted that variations and distribution of oxygen concentration derived from the profile of a solid-liquid interface are present to some extent, an attempt to improve the oxygen concentration distribution over a wafer surface has been carried out through the control of the above-mentioned factors such as rotation of a crystal.

SUMMARY OF THE INVENTION

The present invention has been accomplished to solve the above-mentioned problems, and an object of the invention is to obtain at high productivity a silicon single crystal and a silicon wafer by the CZ method such that neither a V-rich region nor an I-rich region is present and a defect density is very low over the entire crystal cross section, as well as to improve the oxygen concentration distribution over the surface of a silicon wafer.

According to a first aspect of the present invention, there is provided a method for manufacturing a silicon single crystal in accordance with a Czochralski method, wherein during the growth of a silicon single crystal, pulling is performed such that a solid-liquid interface in the crystal, excluding a peripheral 5 mm-width portion, exists within a range of an average vertical position of the solid-liquid interface ±5 mm.

As a result of pulling a crystal such that the crystal growth interface (solid-liquid interface) in the crystal, excluding a peripheral 5 mm-width portion, exits within a range of an average vertical position of the solid-liquid interface ±5 mm, the crystal has only a neutral region (hereinafter referred to as the N region) and has neither a V-rich region nor an I-rich region, which contain many defects. Also, the oxygen concentration distribution over a wafer surface can be improved significantly. The peripheral 5 mm-width portion of the solid-liquid interface is excluded because the 5 mm-width portion exhibits significant variations in profile and is unstable.

According to a second aspect of the present invention, there is provided a method for manufacturing a silicon single crystal in accordance with the Czochralski method, wherein during the growth of a silicon single crystal, a furnace temperature is controlled such that a temperature gradient difference $\Delta G$ (=Ge−Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal.

Thus, during the growth of a crystal, through the adjustment of a so-called hot zone (hereinafter referred to as HZ), i.e., through the control of the furnace temperature such that the temperature gradient $\Delta G$ (=Ge−Gc) is not greater than 5° C./cm-where Ge is the temperature gradient (° C./cm) at the peripheral portion of the crystal, and Gc is the temperature gradient (° C./cm) at the central portion of the crystal-pulling can be performed only in the N region between the V-rich region and the I-rich region. Also, the pulling rate can be determined accordingly. Thus, a silicon single crystal can be grown in a stable manner and at high productivity by the CZ method that is carried out while only the N region is formed so that the defect density is very low over the entire cross section of a crystal. Accordingly, wafer can be manufactured stably, while maintaining high productivity.

Also, during the growth of a crystal, through attainment of the temperature gradient difference $\Delta G$ of not greater than 5° C./cm, the solid-liquid interface in the crystal, excluding a peripheral 5 mm-width portion, exits within a range of an average vertical position of the solid-liquid interface ±5 mm. Thus, the oxygen concentration distribution over a wafer surface can be improved significantly.

In this case, the temperature gradient G (amount of change in temperature/length along crystal axis; ° C./cm) in the vicinity of the solid-liquid interface of a crystal may be a temperature gradient in an in-crystal descending temperature zone between 1420° C. and 1350° C. or between a melting point of silicon and 1400° C., preferably between a melting point of silicon and 1400° C. for execution of more accurate control.

According to a third aspect of the present invention, there is provided a method for manufacturing a silicon single crystal according to a Czochralski method with a magnetic field applied, wherein during the growth of a silicon single crystal, a furnace temperature is controlled such that a temperature gradient difference $\Delta G$ (=Ge−Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal.

Thus, in the Czochralski method with a magnetic field applied, through the pulling of a crystal such that $\Delta G$ is not greater than 5° C./cm, the N region expands, and thus the range of control expands accordingly. This further facilitates the growth of a silicon single crystal and a silicon wafer that are almost free of crystal defects.

Preferably, the applied magnetic field is a horizontal magnetic field. Also, preferably, the intensity of the applied magnetic field is not less than 2000 G.

In order to expand the N region and make the solid-liquid interface flat through the suppression of convection of a silicon melt, a horizontal magnetic field is preferred to a vertical magnetic field or to a cusp magnetic field. The application of a magnetic field does not yield much effect if the intensity of the magnetic field is less than 2000 G.

Further preferably, control is performed such that the length of a portion of a crystal corresponding to an in-crystal descending temperature zone between 1300° C. and 1000° C. is not longer than 8 cm. Still further preferably, control is performed such that a transit time across an in-crystal descending temperature zone of 1300–1000° C. is not longer than 80 minutes.

The above-described conditions mean pulling conditions that determine the pulling rate or temperature gradient in a solid crystal portion located above the solid-liquid interface. Through the execution of the control under the conditions, the absolute value of the temperature gradient G becomes relatively large. Thus, even at a relatively high pulling rate, pulling can be performed in the N region.

When the length of a portion of a crystal corresponding to an in-crystal descending temperature zone between 1300° C. and 1000° C. is in excess of 8 cm, the absolute value of the temperature gradient G becomes relatively small. As a result, in order to obtain a silicon single crystal whose defect density is very low over the entire crystal cross section or a silicon wafer whose defect density is very low over the entire surface, the pulling rate must be made excessively low. Likewise, when a transit time across an in-crystal descending temperature zone of 1300–1000° C. is longer than 80 minutes, the absolute value of the temperature gradient G becomes relatively small. As a result, in order to obtain a silicon single crystal whose defect density is very low over the entire crystal cross section or a silicon wafer whose defect density is very low over the entire surface, the pulling rate must be made excessively low. Thus, high productivity is difficult to maintain in a stable manner.

Still further preferably, the pulling rate and the temperature gradient G in an in-crystal descending temperature zone between 1420° C. and 1350° C. or between a melting point of silicon and 1400° C. in the vicinity of the solid-liquid interface are adjusted such that the crystal is grown, across its entire cross section, in the neutral region near the boundary region between the vacancy-rich region and the interstitial-rich region. Thus, variation of defect density over the entire cross section of the crystal can be reduced.

When a crystal is pulled according to a conventional method which does not consider the concept of the N region, the temperature gradient difference $\Delta G$ (=Ge–Gc) becomes relatively large; consequently, formation of only the N region over the entire crystal cross section is impossible. However, as mentioned previously, through the control of $\Delta G$ to a level not higher than 5° C./cm and through the adequate adjustment of the pulling rate, the N region can be formed over the entire crystal cross section. The N region is little susceptible to the generations of vacancies or interstitials, establishes a relatively low defect density over the entire crystal cross section, and exhibits a relatively small variation in the defect density over the entire crystal cross section; thus, stable quality is imparted to a grown single crystal as well as wafers obtained from the single crystal.

According to a fourth aspect of the present invention, there is provided an apparatus for manufacturing a silicon single crystal according to a Czochralski method, wherein during the growth of a silicon single crystal, a furnace temperature is established such that a temperature gradient difference $\Delta G$ (=Ge–Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal. According to a fifth aspect of the present invention, there is provided an apparatus for manufacturing a silicon single crystal according to a Czochralski method with a magnetic field applied, wherein during the growth of a silicon single crystal, a furnace temperature is established such that a temperature gradient difference $\Delta G$ (=Ge–Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal.

In the apparatuses for manufacturing a silicon single crystal according to the present invention, a solid-liquid interface heat insulator is preferably arranged above a silicon melt so as to enclose a silicon single crystal, and a gap of 3–5 cm is formed between the surface of the melt and the bottom end of the solid-liquid interface heat insulator.

Through use of an apparatus capable of establishing $\Delta G$ not higher than 5° C./cm, particularly the apparatus with a magnetic field applied, a crystal can be pulled while only the crystal-defect-free N region is formed in the crystal. For example, through the arrangement of the solid-liquid interface heat insulator so as to enclose HZ and to form a gap of 3–5 cm between the surface of a melt and the bottom end of the solid-liquid interface heat insulator, the solid-liquid interface is sufficiently irradiated with radiant heat from a heater. Accordingly, the apparatus for manufacturing a silicon single crystal, which can control the temperature gradient difference $\Delta G$ (=Ge–Gc) in the vicinity of the solid-liquid interface to a level not higher than 5° C./cm, can be obtained. Thus, there can be stably grown a silicon single crystal and a silicon wafer which contain very few crystal defects through use of the apparatus according to the present invention.

When the gap between the bottom end of the solid-liquid heat insulator and the surface of the melt is less than 3 cm, the irradiation of the solid-liquid interface with radiant heat from the heater or the like becomes insufficient. As a result, the temperature gradient difference $\Delta G$ (=Ge–Gc) in the vicinity of the solid-liquid interface attains a level in excess of 5° C./cm. Thus, there cannot be formed the N region, which is neither the V-rich region nor the I-rich region contained many defects. As a result, there cannot be grown a silicon single crystal whose defect density is very low over the entire crystal cross section or a silicon wafer whose defect density is very low over the entire surface. By contrast, when the gap is in excess of 5 cm, the temperature gradient G becomes relatively small. As a result, in order to obtain a silicon single crystal whose defect density is very low over the entire crystal cross section or a silicon wafer whose defect density is very low over the entire surface, the pulling rate must be made excessively low. Thus, high productivity is difficult to maintain in a stable manner.

According to a sixth aspect of the present invention, there is provided a silicon single crystal grown by the method according to any of the first through third aspects or by the apparatus according to the fourth or fifth aspect.

Through the growth of a silicon single crystal by the method according to any of the first through third aspects or by the apparatus according to the fourth or fifth aspect, a silicon single crystal can be pulled stably in the N region. The thus-grown silicon single crystal contains very few crystal defects such as FPD, LSTD, COP, and L-SEPD, and a wafer obtained from the silicon single crystal exhibits an improved oxygen concentration distribution over the surface of the wafer.

According to an eighth aspect of the present invention, there is provided a silicon single crystal grown by the Czochralski method, wherein variation in oxygen concentration in a direction perpendicular to a growth direction is not higher than 5%.

According to the present invention, $\Delta G$ is controlled to a level not higher than 5° C./cm. Also, the profile of the solid-liquid interface is made sufficiently flat. Accordingly, there can be obtained a silicon single crystal having a uniform oxygen concentration distribution. Particularly, the present invention provides a single-crystal ingot which exhibits a uniform oxygen concentration distribution in a direction perpendicular to a growth direction over substantially the entire length of the bar (i.e., the oxygen concentration distribution is uniform over the entire surface of a wafer obtained through slicing the single-crystal ingot).

According to a ninth aspect of the present invention, there is provided a silicon wafer whose FPD density is not greater than 100 defects/cm$^2$ and whose density of SEPD having a size not smaller than 10 $\mu$m is not greater than 10 defects/cm$^2$.

Thus, a silicon wafer obtained from a silicon single crystal that is grown according to the present invention contains very few grown-in defects such as FPD, LSTD, COP, and L-SEPD and thus is very useful.

Preferably, in a silicon wafer of the present invention, in addition to a feature of few crystal defects, an in-plane distribution of oxygen concentration is not greater than 5%.

Herein, the in-plane distribution of oxygen concentration is a value obtained by dividing the difference between the maximum value of oxygen concentration over the surface of a wafer and the minimum value of oxygen concentration over the surface of the wafer by the maximum value, or a value obtained by dividing the difference between the maximum value of oxygen concentration over the surface of the wafer and the minimum value of oxygen concentration over the surface of the wafer by the average value of oxygen concentration measurements. According to the present invention, the thus-calculated in-plane distribution of oxygen concentration becomes 5% or less.

The present invention reduces grown-in defects, such as FPD, L-SEPD, and COP, which are generated in a silicon single crystal grown by the CZ method or the MCZ method. The invention also enables a silicon single crystal to be grown such that a wafer obtained from the silicon single crystal is free of defects over the entire surface of the wafer. In the growth, productivity is hardly impaired by virtue of a relatively high pulling rate. Additionally, the variation of oxygen concentration over a wafer surface is improved.

BRIEF DESCRIPTION OF THE DRAWINGS

FIGS. 9A and 9B are views each showing a cross section in the vicinity of the solid-liquid interface of a crystal the purpose of explaining the crystal growth theory of the present invention, wherein FIG. 9A shows a cross section of a crystal manufactured by a conventional method and having V, N, and I regions, while FIG. 9B shows a cross section of a crystal manufactured by the method of the present invention and having an N region only;

DESCRIPTION OF THE INVENTION AND THE PREFERRED EMBODIMENTS

The present invention will now be described in detail, but the present invention is not limited thereto. First, terms appearing herein will be described.

1) FPD (Flow Pattern Defect) denotes flow patterns which, together with pits, are generated in the surface of a wafer which is sliced from a grown silicon single-crystal ingot and which is treated by the steps of: removing a damaged layer from the surface portion of the wafer through etching with a mixed solution of hydrofluoric acid and nitric acid; and etching the wafer surface with a mixed solution of $K_2Cr_2O_7$, hydrofluoric acid, and water (Secco etching). As FPD density in the wafer surface portion becomes higher, defects with regard to dielectric breakdown strength of oxide film increase (Japanese Patent Laid-Open (kokai) No. 4-192345).

2) SEPD (Secco Etch Pit Defect) denotes pits which are generated alone in the surface portion of a wafer which is Secco-etched in the same manner as in the case of FPD. Pits accompanied by flow patterns are generically referred to as FPD. SEPD having a size not smaller than 10 $\mu$m conceivably derives from a dislocation cluster. When a dislocation cluster is present in a device, current leaks through the dislocation; consequently, the function of a P-N junction is not effected.

3) LSTD (Laser Scattering Tomography Defect) denotes a defect existing in a wafer which is sliced from a grown silicon single-crystal ingot and which is treated by the steps of: removing a damaged layer from the surface portion of the wafer through etching with a mixed solution of hydrofluoric acid and nitric acid; and cleaving the wafer. Infrared light is introduced into the wafer through the cleavage plane, and light exiting from the wafer surface is observed in order to detect a scattered light from the defects in the wafer. A scattered light detected in this observation has already been reported at a meeting of an academic society or the like and is considered to be oxide precipitates (J.J.A.P. vol. 32, p.3679, 1993). According to recent research, LSTD is reportedly an octahedral void.

4) COP (Crystal Originated Particle) denotes a defect which degrades the dielectric breakdown strength of oxide film at a central portion of a wafer and which is revealed as FPD in the case of treatment through Secco etch, but is revealed as COP in the case of cleaning in ammonia hydrogen peroxide ($NH_4OH:H_2O_2:H_2O=1:1-2:5-7$) which serves as a selective etchant. A pit has a diameter not greater than 1 $\mu$m and is examined by a light scattering method.

The inventors of the present invention intensively studied a region located in the vicinity of the boundary between the V region and the I region in association with the growth of a silicon single crystal according to the CZ method. As a result, the inventors found that there exists a very narrow neutral region in the vicinity of the boundary, in which defects such as FPD, LSTD, and COP are very few and large SEPD does not exist.

Figure 4:
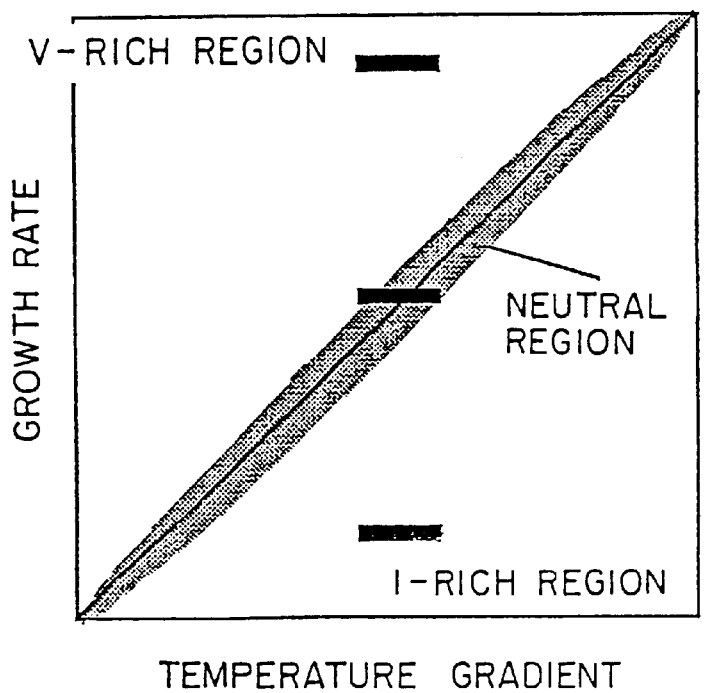
FIG. 4 is a graph showing the relation between a pulling (growth) rate and a temperature gradient as measured in a crystal in the vicinity of the solid-liquid interface of the crystal, for the purpose of explaining the crystal growth theory of the present invention.

Thus, the present inventors have taken an approach of expanding the neutral region over the entire surface of a wafer to thereby significantly reduce point defects. The growth rate (pulling rate) and the temperature gradient hold the relation as shown in FIG. 4. Since the pulling rate is substantially constant within a cross section of a growing crystal (which corresponds to the surface of a wafer and is hereinafter referred to as a wafer plane), the temperature gradient is a major factor that determines the distribution of point defect density in a wafer plane. In other words, a problem is that there exists a difference in an axial temperature gradient within a wafer plane. Thus, the present inventors came to the conclusion that through the reduction of the temperature gradient difference, a point defect density could be made uniform over a wafer plane.

The present inventors also found that through the elimination of a difference in an axial temperature gradient within a wafer plane, the profile of the solid-liquid interface of a growing silicon single crystal could be made flat to thereby improve the oxygen concentration distribution within the surface of a wafer.

Figure 5:
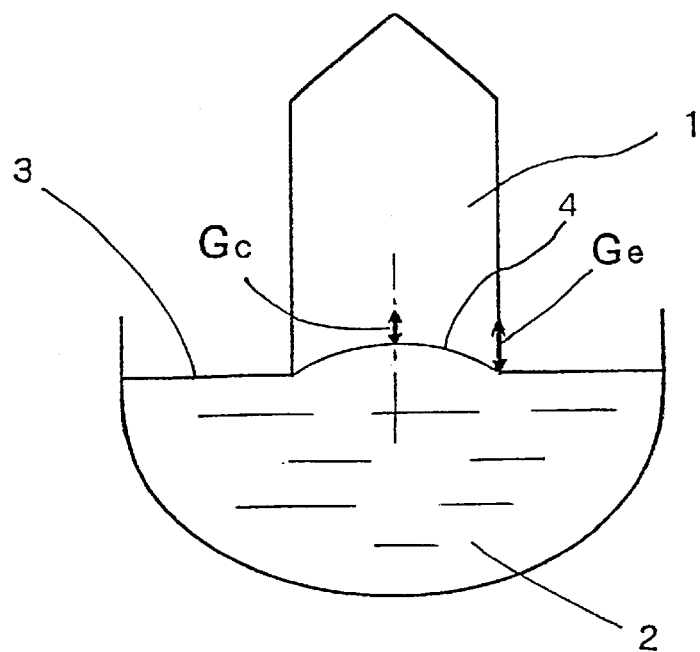
FIG. 5 is a view showing locations of measuring a temperature gradient in a crystal in the vicinity of the solid-liquid interface of the crystal in the present invention.

Thus, the present inventors examined the difference between a temperature gradient Gc at a central portion of a growing crystal and a temperature gradient Ge at a peripheral portion of the growing crystal, as shown in FIG. 5. As a result, it was confirmed that a temperature gradient difference (Ge−Gc) is at least 15° C./cm and increases with the absolute value of the temperature gradient G. In some case, the temperature gradient difference (Ge−Gc) is as large as 40° C./cm.

When there is the temperature gradient difference between a central portion of a growing crystal and a peripheral portion of the growing crystal, the solid-liquid interface (crystal growth interface) 4 does not become flat and becomes upwardly convex as shown in FIG. 5. When a temperature gradient difference ΔG is 15° C./cm as mentioned above, the central portion of the solid-liquid interface in the crystal, excluding a peripheral 5 mm-width portion, deviates from the range of an average vertical position of the solid-liquid interface ±5 mm.

As a result, a wafer obtained by slicing a crystal ingot grown by the conventional CZ method has on a surface thereof growth striations derived from different times of growth. Consequently, an oxygen concentration is distributed in the surface of the wafer in accordance with variations in oxygen concentration in the direction of crystal growth.

Figure 6:
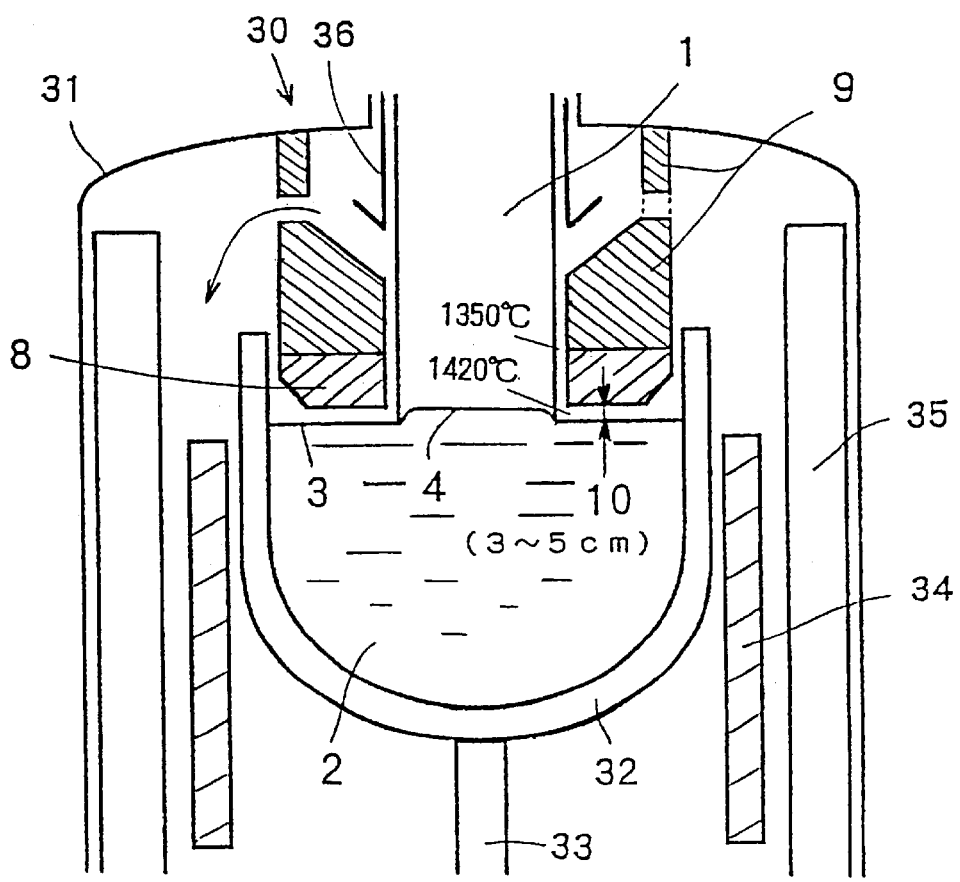
FIG. 6 is a partial enlarged view of FIG. 1, showing a heat insulator disposed in the vicinity of the solid-liquid interface in the single crystal pulling apparatus of the present invention.

The present inventors intensively studied a method for reducing a difference in the temperature gradient G through use of, for example, a comprehensive heat transfer analysis software so called FEMAG (F. Dupret, P. Nicodeme, Y. Ryckmans, P. Wouters, and M. J. Crochet, Int. J. Heat Mass Transfer, 33, 1849 (1990)). As shown in FIG. 6, the study revealed the idea of heat-insulating portion of a crystal corresponding to an in-crystal descending temperature zone of 1420–1350° C. or corresponding to an in-crystal descending temperature zone between the melting point of silicon and 1400° C. Also was revealed the idea of directly exposing a crystal portion located in the vicinity of the solid-liquid interface to radiant heat from a melt. The remaining low-temperature portion of a growing crystal is cooled as much as possible.

Figure 3:
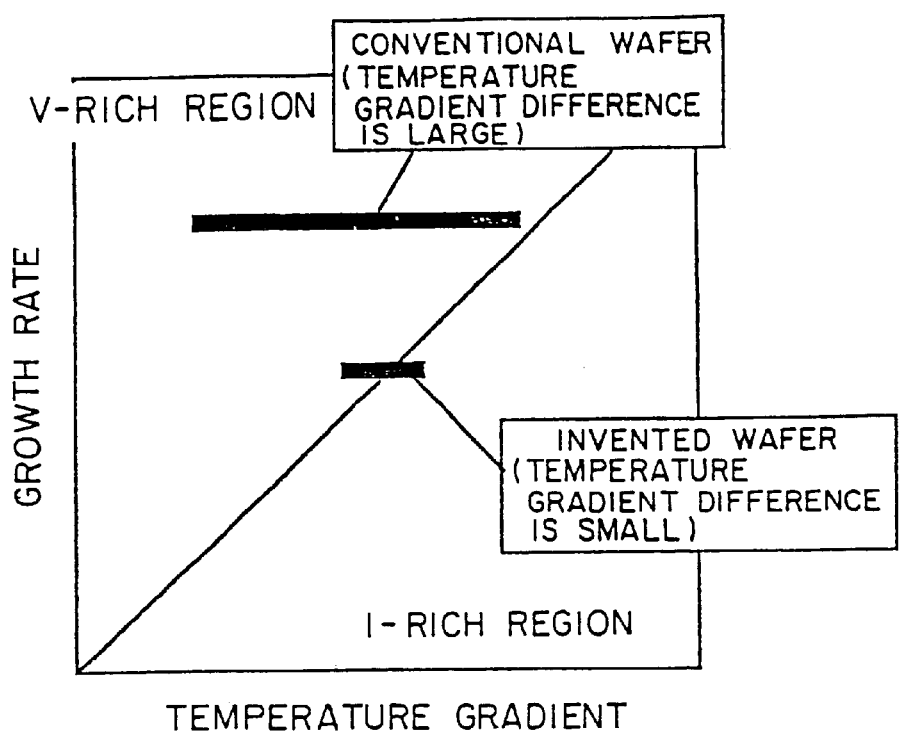
FIG. 3 is a graph comparing wafers grown by a conventional method and by a method of the present invention in terms of the relation between a pulling (growth) rate and a temperature gradient as measured in a crystal in the vicinity of the solid-liquid interface of the crystal, for the purpose of explaining the crystal growth theory of the present invention.

Specifically, the solid-liquid interface heat insulator is arranged above a silicon melt so as to enclose a silicon single crystal. A gap of 3–5 cm is formed between a bottom portion of the heat insulator and the surface of the melt. This arrangement allows the solid-liquid interface to be sufficiently irradiated with radiant heat from a heater. As a result, there is formed a heat distribution that the temperature gradient difference ΔG (=Ge−Gc) becomes 5° C./cm or less, as shown in FIG. 3, which shows the relation between the crystal growth rate and the temperature gradient. This indicates the presence of a hot zone which contain few vacancies or interstitials.

Thus, through the execution of the following furnace temperature control during pulling a silicon single crystal, the crystal pulling rate in the N region existing between the V-rich region and the I-rich region, was determined, the N region was formed over the entire surface of a wafer, and point defects were hardly observed on the surface (FIG. 4). The furnace temperature is controlled based on the HZ concept such that a temperature gradient difference ΔG (=Ge−Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal.

As seen in FIG. 4 at an upper position, even in HZ in which ΔG is not greater than 5° C./cm, the V-rich region is formed in a crystal if a growth rate is excessively high. By contrast, as seen in FIG. 4 at a lower position, if a growth rate is excessively low, the I-rich region is formed in a crystal. Through the selection of an appropriate growth rate, the N region is formed over the entire cross section of a crystal as illustrated in FIG. 4 at a central position.

Figure 7:
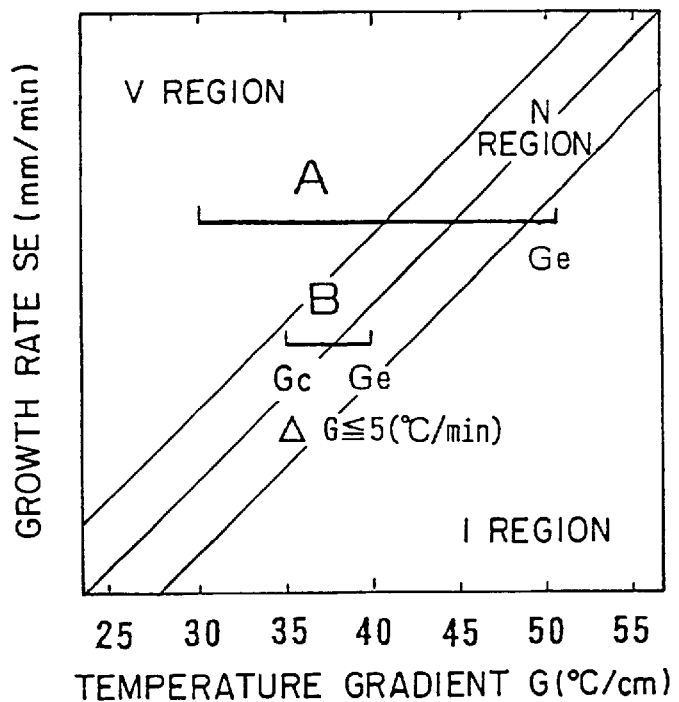
FIG. 7 is a graph corresponding to FIG. 3 but shown by specific data.
Figure 9A:
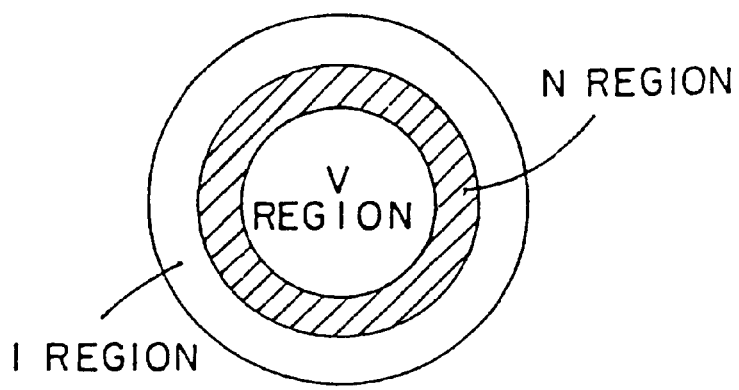

The relation between temperature gradient control and the establishment of the I, V, and N regions in a crystal will now be described. As shown in FIG. 7, according to the conventional CZ method, when, for example, Gc=30° C./cm and Ge=50° C./cm, HZ shows ΔG=Ge−Gc=20° C./cm, as represented by the symbol A. In the position of the symbol A in FIG. 7, a crystal is grown at a relatively high growth rate. In the thus-grown single crystal, the I, V, and N regions are formed as shown in FIG. 9A. In the cross section of the single crystal of FIG. 9A, the V and I regions having many defects are formed at the central and peripheral portions, respectively, while the N region having few defects is circularly formed between the V region and the I region.

Figure 9B:
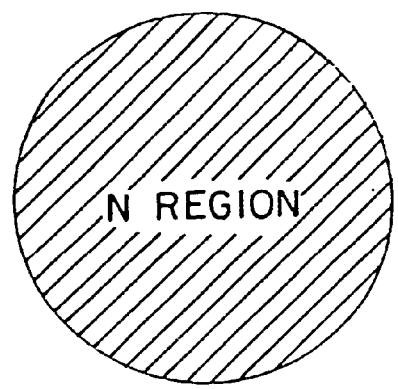

By contrast, according to the present invention, when, for example, Gc=35° C./cm and Ge=40° C./cm, HZ shows ΔG=Ge−Gc=5° C./cm, as represented by the symbol B of FIG. 7. In the position of the symbol B, a crystal is grown at a relatively low growth rate. As shown in FIG. 9B, in the cross section of the thus-grown single crystal, the N region having few defects is formed thoroughly.

Figure 8:
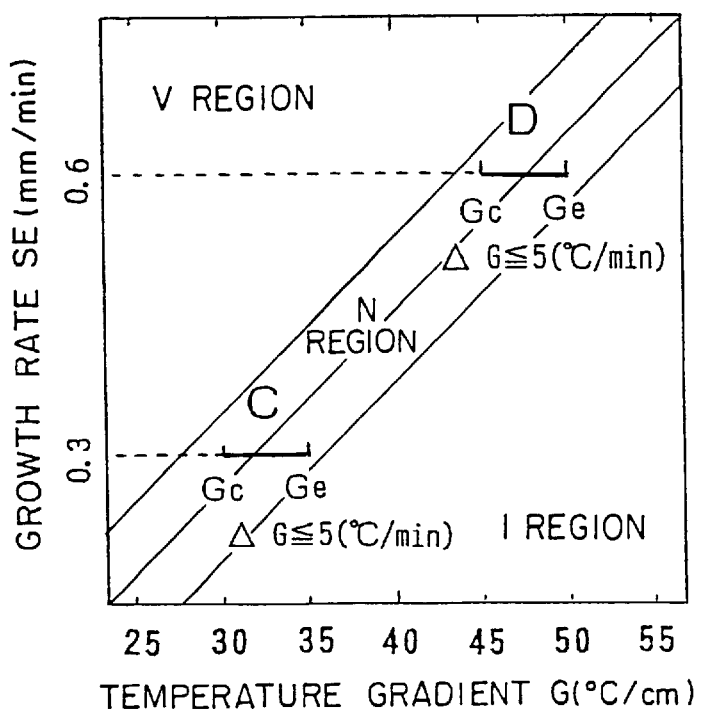
FIG. 8 is a graph corresponding to FIG. 4 but shown by specific data.

However, in the above-mentioned growth of a crystal, a growth rate is relatively low. Thus, as shown in FIG. 8, the HZ condition as represented by a symbol C is modified to that as represented by a symbol D while the temperature gradient difference ΔG (=Ge−Gc) is sustained at a level not higher than 5° C./cm. In other words, the absolute value of the temperature gradient G (Gc or Ge) as represented by the symbol C are increased to those as represented by the symbol D. As a result, a crystal can be grown at a relatively high growth rate while the N region is formed over the entire cross section of the crystal. Therefore, a high productivity can be maintained.

When the above phenomenon was observed in terms of a temperature gradient of a crystallized portion located above the solid-liquid interface, it was revealed that the phenomenon could be achieved through the control of the length of a crystal portion corresponding to an in-crystal descending temperature zone of 1300–1000° C. to 8 cm or shorter. When the length of a portion corresponding to the temperature zone is in excess of 8 cm, the absolute value of the temperature gradient G becomes relatively small. Thus, a relatively lower pulling rate must be selected, thus impairing production efficiency.

Further, when the above phenomenon is observed in terms of the pulling rate, it is revealed that a transit time across an in-crystal descending temperature zone of 1300–1000° C. must be controlled to 80 minutes or shorter. When slow cooling corresponding to a transit time in excess of 80 minutes is performed, the absolute value of the temperature gradient G becomes relatively small. As a result, in order to obtain a crystal while the N region is formed, the pulling rate must be made relatively low, thus impairing production efficiency.

When a crystal is pulled while ΔG is held at a level not higher than 5° C./cm, the solid-liquid interface in the crystal, excluding a peripheral 5 mm-width portion, exists within the range of an average vertical position of the solid-liquid interface ±5 mm, particularly ±2.5 mm. This facilitates the growth of a crystal in which the N region is formed. Further, an in-plane distribution of oxygen concentration is also improved.

There have been described the pulling conditions used in the present invention for pulling a crystal while the N region is formed. The pulling conditions will now be summarized. The pulling rate and the temperature gradient G in an in-crystal descending temperature zone between 1420° C. and 1350° C. or between a melting point of silicon and 1400° C. in the vicinity of the solid-liquid interface are adjusted such that pulling is performed while a neutral region is formed over the entire cross section of the portion. The neutral region is a boundary region between a vacancy (V)-rich region and an interstitial (I)-rich region and exhibits a relatively small variation in defect density over the entire cross section. As a result, an in-plane distribution of oxygen concentration is significantly improved.

When ΔG is held at a level not higher than 5° C./cm and the absolute value of the temperature gradient G is held at a desired level, the pulling rate for pulling a crystal while the N region is formed over the entire cross section of the crystal is obtained in accordance with the following steps. For example, a single crystal ingot is pulled at a relatively high rate so as to obtain ΔG not higher than 5° C./cm, thereby growing a V-rich crystal. Subsequently, while ΔG is held at a level not higher than 5° C./cm, the growth rate is gradually decreased to a level at which an I-rich crystal is grown. The thus-obtained single crystal is cut in a longitudinal direction to check for crystal defects. This reveals a growth rate corresponding to the N region, which is sandwiched between the V-rich region and the I-rich region.

In this case, when a crystal is pulled by the Czochralski method with a magnetic field applied to a silicon melt (MCZ method), while ΔG is held at a level not higher than 5° C./cm, the N region expands. This expands the range of the pulling rate at which the N region is formed, thereby facilitating the growth of a single crystal in which the N region is thoroughly formed.

Figure 1:
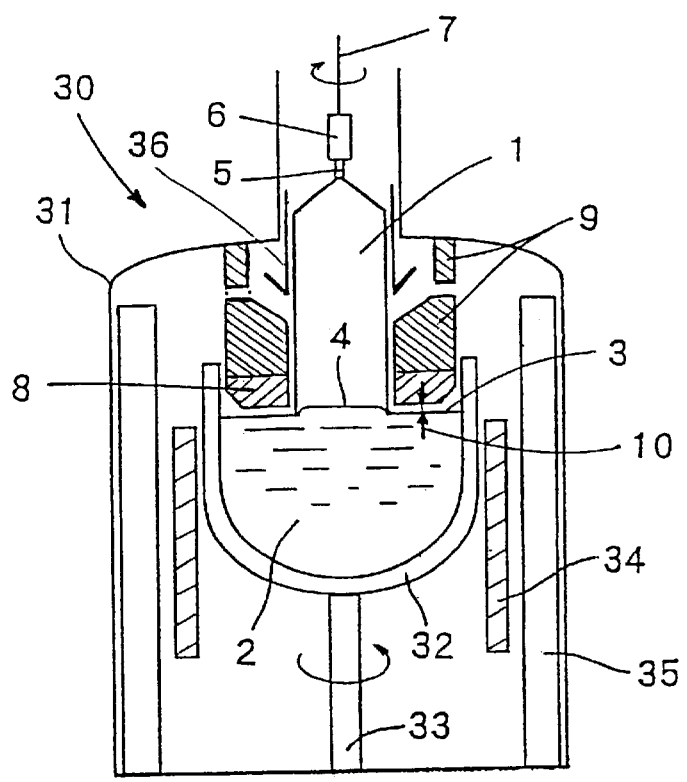
FIG. 1 is a schematic view showing a crystal pulling apparatus according to the present invention which operates in accordance with the Czochralski method.

Embodiments of the present invention will now be described in detail with reference to the drawings. FIG. 1 shows a crystal pulling apparatus according to the present invention which operates in accordance with the Czochralski method. As shown in FIG. 1, a crystal pulling apparatus 30 includes a pull chamber 31, a crucible 32 provided within the pull chamber 31, a heater 34 disposed around the crucible 32, a crucible-holding shaft 33 for rotating the crucible 32 and a rotation mechanism (not shown) for rotating the crucible-holding shaft 33, a seed chuck 6 for holding a silicon seed crystal 5, a cable 7 for raising the seed chuck 6, and a winding mechanism (not shown) for rotating or winding up the cable 7. The crucible 32 includes an inner quartz crucible for containing a silicon melt 2 and an outer graphite crucible located outside the quartz crucible. A heat insulator 35 is disposed around the heater 34.

In order to establish growth conditions according to the manufacturing method of the present invention, an annular solid-liquid interface heat insulator 8 is arranged around the solid-liquid interface of a growing crystal. An upper annular heat insulator 9 is arranged on the interface heat insulator 8. A gap 10 of 3–5 cm is formed between the bottom end of the interface heat insulator 8 and the surface of the silicon melt 2. The employment of the upper heat insulator 9 depends on working conditions. Further there is provided a cylindrical cooling device 36 for cooling a single crystal by shielding radiant heat or through jetting of a cooling gas.

Figure 12:
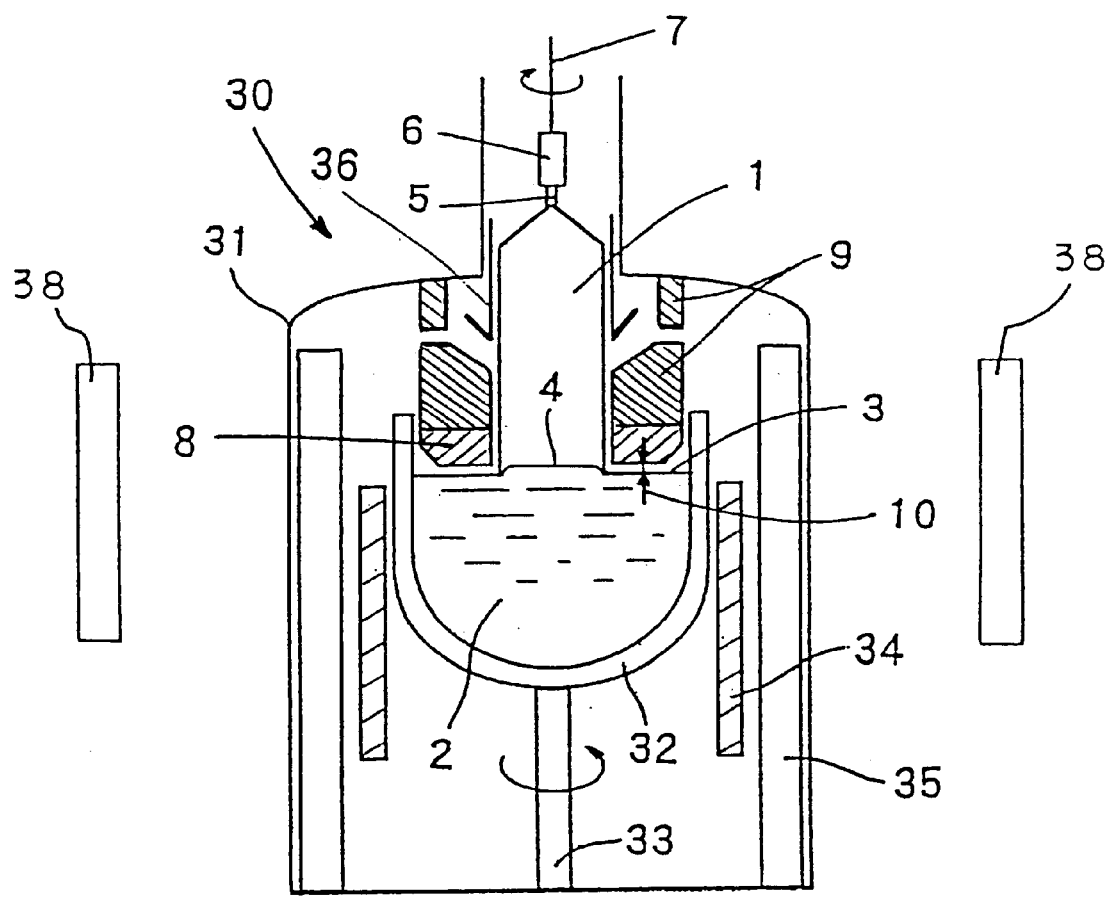
FIG. 12 is a schematic view showing a crystal pulling apparatus according to the present invention which operates in accordance with the MCZ method.

Recently, a so-called MCZ method is often employed. As shown in FIG. 12, a magnet 38 is disposed outside the pull chamber 31 in a horizontal direction so as to apply a magnetic field to the silicon melt 2 in a horizontal or vertical direction or in a like direction. The magnet 38 is composed of a normally conducting or superconducting coil or the like. Through the application of a magnetic field to the silicon melt 2, convection of the melt 2 is suppressed to thereby stably grow a single crystal. The direction in which a magnetic field is applied to the melt 2 can be easily modified through the modification of arrangement of the magnet 38. For example, when a single coil is arranged so as to horizontally surround the pull chamber 31, a vertical magnetic field (longitudinal magnetic field) is applied to the melt 2. When two coils are arranged outside the pull chamber 31 such that the coils face each other in a horizontal direction with the pull chamber 31 positioned therebetween, a horizontal magnetic field (lateral magnetic field) is applied to the melt 2.

As mentioned previously, when the above-mentioned MCZ method is used in the present invention, the N region expands, and thus the range of control expands accordingly. This facilitates the growth of a single crystal in which the N region is thoroughly formed.

Next will be described a process of growing a single crystal through use of the crystal pulling apparatus 30 of FIG. 1. First, a high-purity polycrystalline material of silicon is heated to its melting point (approximately 1420° C.) or higher and is thus melted in the crucible 32. Next, the cable 7 is released until a tip of the seed crystal 5 comes into contact with the surface of the melt 2 at a central portion or is immersed into the melt 2 at a central portion. Subsequently, the crucible-holding shaft 33 is rotated in an appropriate direction. At the same time, the cable 7 is rotated and wound up to thereby pull upwardly the seed crystal 5. Thus is started the growth of a single crystal. Then, through the adequate regulation of the pulling rate and temperature, a substantially cylindrical single-crystal ingot 1 can be obtained.

To achieve the objects of the present invention, the invention employs the following structural features.

As shown in FIG. 6, which is a partial enlarged view of FIG. 1, the annular solid-liquid interface heat insulator 8 is disposed in the pull chamber 31 so as to enclose HZ of a single crystal 1. HZ is a portion of the single crystal 1 located in the vicinity of the melt surface and corresponding to an in-crystal descending temperature zone between 1420° C. and 1350° C. (or between a melting point of silicon and 1400° C.). The upper annular heat insulator 9 is located on the interface heat insulator 8. The gap 10 of 3–5 cm is formed between the bottom end of the interface heat insulator 8 and the surface 3 of the silicon melt 2. The employment of the upper heat insulator 9 depends on working conditions. Further, a crystal-cooling device, for example, the cooling device 36, is provided above the upper heat insulator 9. The cooling device 36 discharges a cooling gas against the single crystal 1 from above to thereby cool the single crystal 1. The cooling device 36 may include a radiant heat reflector attached to a lower portion of the cylinder of the device 36.

As mentioned above, a heat insulator is arranged above the surface of a melt with a predetermined gap formed therebetween. Further, a device for cooling a crystal is provided above the heat insulator. This arrangement yields a heat insulation effect in the vicinity of the crystal growth interface by means of radiant heat. An upper portion of the crystal is shielded from radiant heat from a heater or the like. As a result, there becomes relatively small the temperature gradient Ge at a peripheral portion. Also, there becomes relatively small the difference between the temperature gradient Ge at the peripheral portion and the temperature gradient Gc at the central portion. Further, the solid-liquid interface 4 becomes flat. Accordingly, a crystal can be pulled while is formed over the entire cross section of the crystal the N region which exhibits a relatively small variation in defect density.

The present embodiment employs the cylindrical cooling device 36 as the above-mentioned crystal-cooling device. However, in addition to the cylindrical cooling device 36, there may be provided an air-cooled duct, a water-cooled tube, or a like device that surrounds a growing crystal so as to establish a desired temperature gradient in the crystal.

In the present invention, preferably, the magnet 38 is disposed outside the pull chamber 31 as shown in FIG. 12. In this case, a horizontal magnetic field is applied to the melt 2. The intensity of the magnetic field is preferably not less than 2000 G, more preferably not less than 3000 G.

Through the application of a magnetic field to a silicon melt, convection of the melt is suppressed, and thus the N region expands within a crystal. In order to obtain a flat solid-liquid interface, a horizontal magnetic field is preferred to a vertical magnetic field or a cusp magnetic field. Also, the application of a magnetic field does not yield much effect if the intensity of the magnetic field is less than 2000 G.

In contrast to conventional technology, the present invention requires neither an excessive reduction in pulling rate nor slow cooling for a certain temperature zone. Accordingly, single-crystal quality can be improved without an impairment in productivity. Further, an in-plane distribution of oxygen concentration is improved. The employment of the MCZ method will expand control range to thereby assure the growth of a crystal having few defects.

Figure 2:
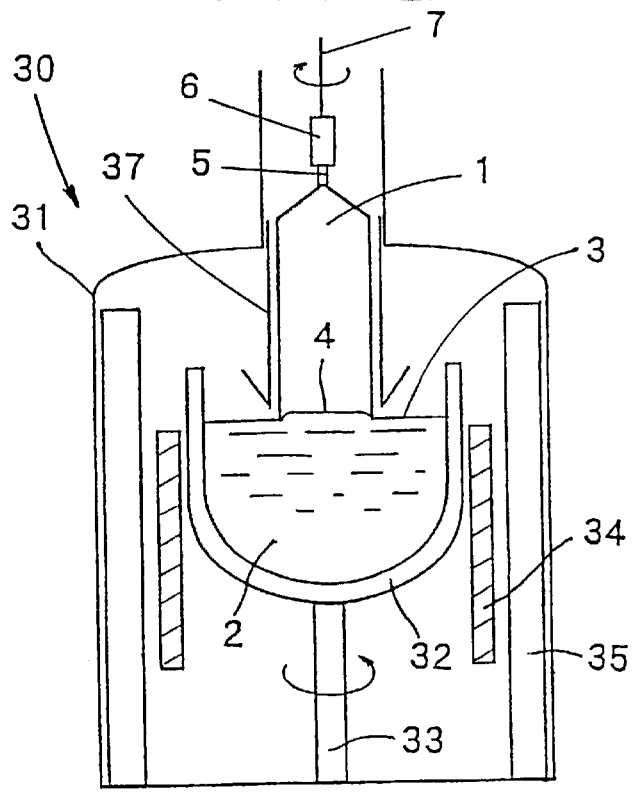
FIG. 2 is a schematic view showing a conventional crystal pulling apparatus which operates in accordance with the Czochralski method.

FIG. 2 shows a conventional crystal pulling apparatus for comparison with the crystal pulling apparatuses according to the present invention shown in FIGS. 1 and 12.

The conventional crystal pulling apparatus of FIG. 2 basically has a structure similar to that of a crystal pulling apparatus of the present invention, but is not equipped with counterparts of the solid-liquid heat insulator 8, the upper annular heat insulator 9, and the cooling device 36 of the present invention.

A silicon single crystal grown by the above-described method and apparatus contain very few crystal defects such as FPD, LSTD, COP, and L-SEPD by virtue of stable pulling in the N region.

Also, an oxygen concentration variation can be made not greater than 5% in a direction perpendicular to a crystal growth direction over the substantially entire length of a single crystal.

A silicon wafer fabricated from such a silicon single crystal exhibits an FPD density not greater than 100 defects/$cm^2$ and an SEPD density not greater than 10 defects/$cm^2$ for SEPD having a size not smaller than 10 $\mu$m. When the thus-fabricated silicon wafer undergoes an oxygen precipitation heat treatment and is observed by means of X rays, uniform precipitation contrast is observed over the surface thereof and a small number of striation rings is observed. That is, by virtue of a growth interface being flat, good uniformity is established in the surface of a wafer, and particularly an in-plane oxygen concentration distribution becomes 5% or less.

EXAMPLES

The present invention will next be described by way of example, which should not be construed as limiting the invention.

Example 1

A silicon single crystal was grown through use of the crystal pulling apparatus 30 of FIG. 1. 60 kg of polycrystalline material of silicon were charged into a quartz crucible having a diameter of 20 inches. A single-crystal ingot of silicon having a diameter of 6 inches and orientation <100> was pulled while the average pulling rate was varied over the range between 1.0 mm/min and 0.4 mm/min (the length of a straight body portion of the single crystal was approximately 85 cm).

The temperature of a silicon melt was 1420° C. An annular solid-liquid interface heat insulator having a height of 10 cm was disposed above the melt surface such that a gap of 4 cm was formed between the melt surface and the bottom end of the interface heat insulator. The height of a ceiling of a pull chamber was adjusted to 30 cm above the melt surface through the adjustment of a crucible-holding shaft. An annular upper heat insulator was disposed on the interface heat insulator.

The temperature gradient in an in-crystal descending temperature zone between a melting point of silicon and 1400° C. in the vicinity of the solid-liquid interface was set as follows: Ge=45.0 (° C./cm); Gc=42.0 (° C./cm); $\Delta G$=Ge−Gc=3.0 (° C./cm). Wafers were sliced from the thus-obtained single crystal ingot. The wafers were mirror-polished, obtaining single-crystal mirror wafers of silicon.

The thus-obtained mirror wafers were measured for an FPD density and an L-SEPD density. Table 1 shows the relation between the pulling rate and the measured defect density.

Figure 10A:
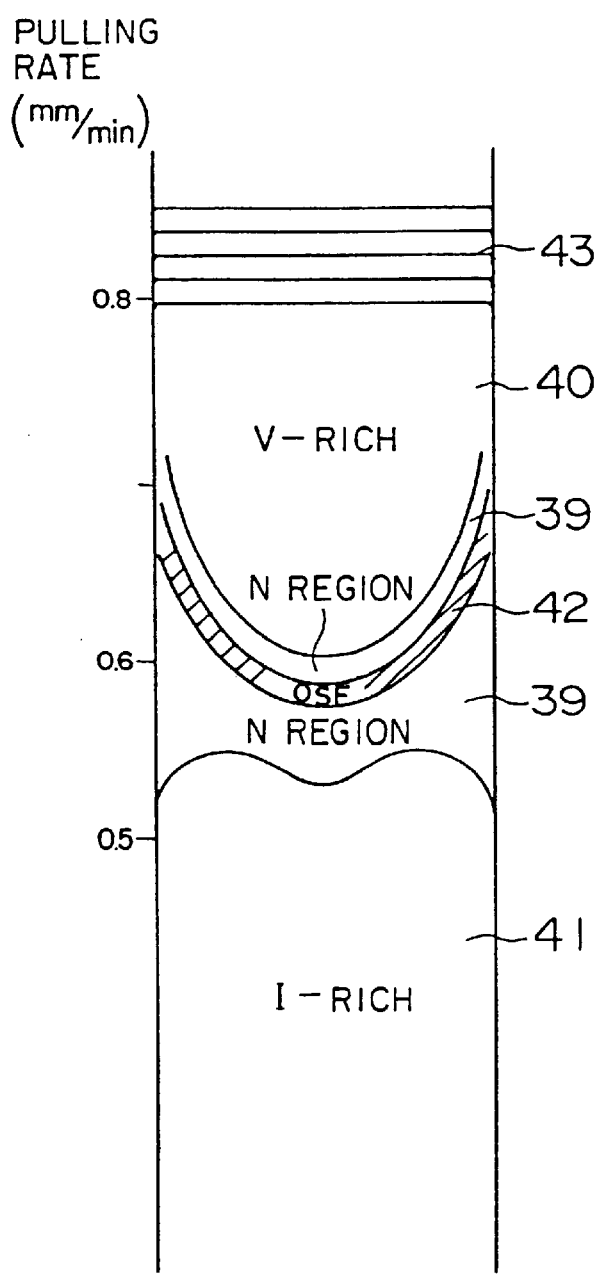
FIG. 10A is a view showing variations in crystal defects in a crystal growth direction as observed in Example 1 (CZ method)

Another single-crystal ingot of silicon was grown in the same manner as above. The single-crystal ingot was split longitudinally to observe variations in crystal defects in the growth direction. The result is shown in FIG. 10A.

TABLE 1

| Pulling rate (mm/min) | Temperature gradient difference G = Ge − Gc (° C./cm) | Region | FPD (defects/$cm^2$) | L-SEPD (defects/$cm^2$) |
|---|---|---|---|---|
| 0.6 | 3.6 | V rich | Approx. 1000 | — |
| 0.55 | 3.6 | N | ≦20 | — |
| 0.5 | 3.6 | I rich | ≧20 | ≧10 |

As seen from Table 1, even when $\Delta G$ is not higher than 5° C./cm and the density of point defects generated in a crystal is uniform over a crystal cross section, a defect state of the crystal becomes V-rich or I-rich unless an adequate pulling rate is selected. As a result of an attempt to find out an appropriate pulling rate for forming the N region (see FIG. 4), it was found that a silicon wafer having the N region formed over the entire surface was obtained at a pulling rate of 0.55 mm/min.

As seen from FIG. 10A, the crystal growth interface profile 43 is flat, and the oxygen concentration distribution is uniform. However, an N region 39 sandwiched between a V-rich region 40 and an I-rich region 41 is relatively narrow. In order to establish the N region 39 over the entire cross section of a crystal, a highly precisely control must be carried out. An OSF region 42 is observed between the N regions 39.

Example 2

A silicon single crystal was grown through use of the crystal pulling apparatus of FIG. 12. A crystal was pulled while a horizontal magnetic field having an intensity of 3000 G was applied to the melt 2. Pulling conditions were identical to those of Example 1 except for the application of a magnetic field.

Specifically, 60 kg of polycrystalline material of silicon were charged into a quartz crucible having a diameter of 20 inches. A single-crystal ingot of silicon having a diameter of 6 inches and orientation <100> was pulled while the average pulling rate was varied over the range between 1.0 mm/min and 0.4 mm/min.

The temperature of a silicon melt was 1420° C. An annular solid-liquid interface heat insulator having a height of 10 cm was disposed above the melt surface such that a gap of 4 cm was formed between the melt surface and the bottom end of the interface heat insulator. The height of a ceiling of a pull chamber was adjusted to 30 cm above the melt surface through the adjustment of a crucible-holding shaft. An annular upper heat insulator was disposed on the interface heat insulator.

The temperature gradient in an in-crystal descending temperature zone between a melting point of silicon and 1400° C. in the vicinity of the solid-liquid interface was set as follows: Ge=45.0 (° C./cm); Gc=42.0 (° C./cm); ΔG=Ge−Gc=3.0 (° C./cm). The thus-obtained single-crystal ingot was split longitudinally to observe variations in crystal defects in a growth direction. The result is shown in FIG. 10B.

Figure 10B:
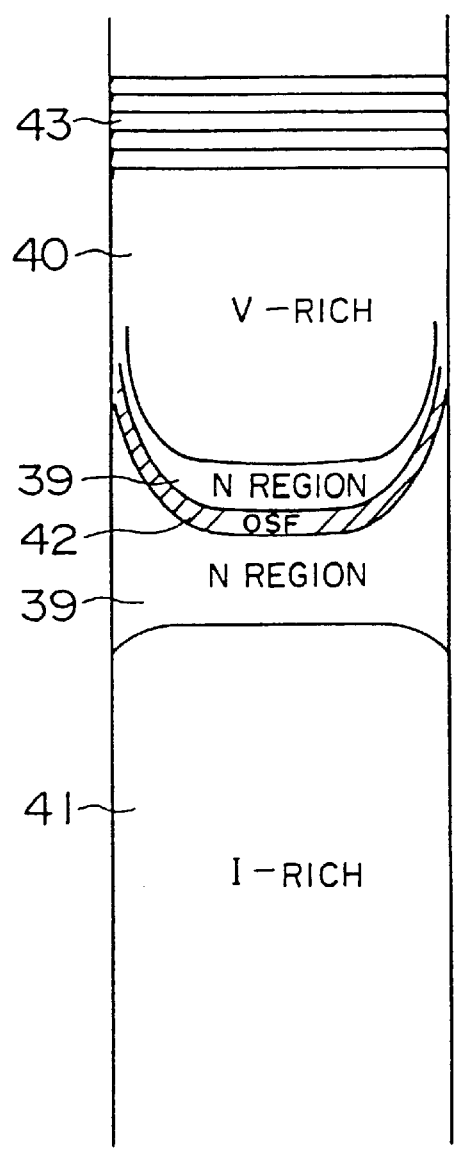
FIG. 10B is a view showing variations in crystal defects in a crystal growth direction as observed in Example 2 (MCZ method)

As seen from FIG. 10B, as in the case of the ordinary CZ method, a silicon wafer having the N region formed over the entire surface can be obtained at a pulling rate ranging between 0.55 mm/min and 0.58 mm/min. Also, the crystal growth interface profile 43 is flat, and the oxygen concentration distribution is uniform.

The single crystal of FIG. 10B differs significantly from that of FIG. 10A in that the N region is widely expanded, indicating that a control range for the pulling rate is significantly expanded, and that the boundaries between the V-rich area and the N area and between the N area and the I-rich area are relatively flat. Thus, when wafers are sliced from a single-crystal ingot grown by the present method, a wafer having the N region formed over the entire surface is more readily obtained.

As mentioned above, the application of a magnetic field causes a significant change in a pattern of the generation of crystal defects. A definite reason for this is so far unknown. Conceivable reasons are as follows. The application of a magnetic field to a melt stabilizes the convection of the melt. Consequently, a temperature gradient in the melt changes accordingly, resulting in a favorable change in the amount of defects generated in a crystal. Such a change in a temperature gradient in the melt favorably influences a temperature gradient in the vicinity of the growth interface of a crystal. Consequently, the temperature gradient in the crystal becomes stable and ideal.

Example 3 and Comparative Example

The influence of the solid-liquid interface profile on oxygen concentration in the surface of a wafer was studied.

A silicon single crystal was grown through use of the crystal pulling apparatus of FIG. 12. 60 kg of polycrystalline material of silicon were charged into a quartz crucible having a diameter of 20 inches. A single-crystal ingot of silicon having a diameter of 8 inches and orientation <100> was pulled while a magnetic field having an intensity of 3000 G was applied.

The temperature of a silicon melt was 1420° C. An annular solid-liquid interface heat insulator having a height of 10 cm was disposed above the melt surface such that a gap of 4 cm was formed between the melt surface and the bottom end of the interface heat insulator. The height of a ceiling of a pull chamber was adjusted to 30 cm above the melt surface through the adjustment of a crucible-holding shaft. An annular upper heat insulator was disposed on the interface heat insulator.

The temperature gradient in an in-crystal descending temperature zone between a melting point of silicon and 1400° C. in the vicinity of the solid-liquid interface was set as follows: Ge=32.6 (° C./cm); Gc=30.5 (° C./cm); ΔG=Ge−Gc=2.1 (° C./cm).

Figures 11A, 11B:
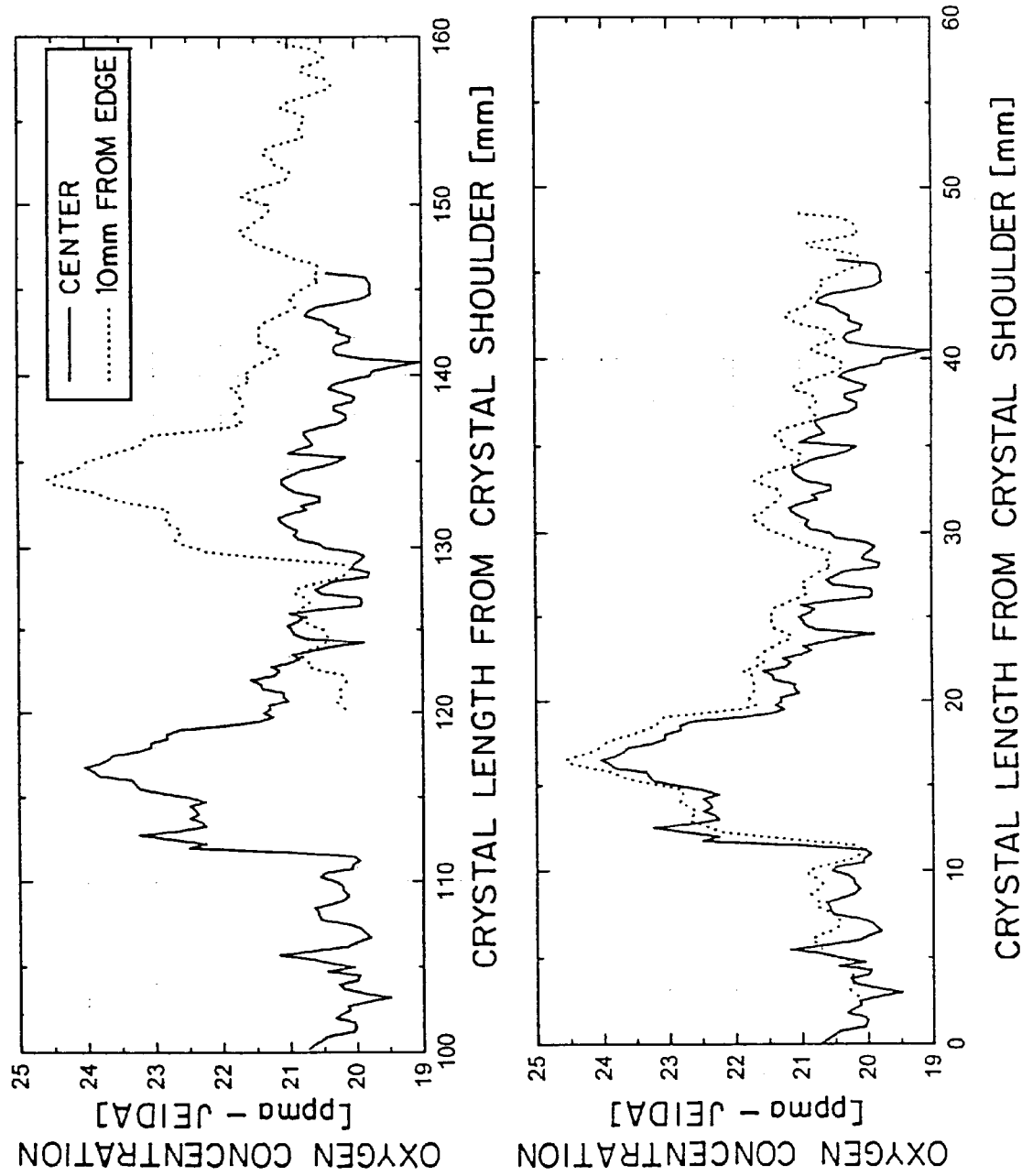
FIG. 11A is a graph showing oxygen concentration measurements in Comparative Example.
FIG. 11B is a graph showing oxygen concentration measurements in Example 3.

The thus-obtained single-crystal ingot was split longitudinally to observe variations in oxygen concentration in a growth direction at a central portion of the crystal and a peripheral portion of the crystal. The result is shown in FIG. 11B (Example 3).

In this case, the profile of the solid-liquid interface in a crystal was slightly upwardly convex, but was almost flat. Specifically, the solid-liquid interface in the crystal, excluding a peripheral 5 mm-width portion, exists within a range of an average vertical position of the solid-liquid interface ±2 mm.

In Comparative Example, a silicon single crystal was grown through use of the crystal pulling apparatus of FIG. 12 except that the solid-liquid interface heat insulator and the upper annular heat insulator were removed. A single-crystal ingot of silicon having a diameter of 8 inches was pulled while a magnetic field having an intensity of 3000 G was applied.

In this case, the temperature gradient in the vicinity of the solid-liquid interface was set as follows: Ge=63.5 (° C./cm); Gc=30.4 (° C./cm); ΔG=Ge−Gc=33.1 (° C./cm).

The thus-obtained single-crystal ingot was split longitudinally to observe variations in oxygen concentration in a growth direction at a central portion of the crystal and a peripheral portion of the crystal. The result is shown in FIG. 11A (Comparative Example).

In this case, the profile of the solid-liquid interface in a crystal was upwardly convex. Specifically, the solid-liquid interface in the crystal, excluding a peripheral 5 mm-width portion, exists within a range of an average flatness of the solid-liquid interface ±10 mm.

In FIG. 11A, oxygen concentration differs significantly between the central portion of the crystal and the peripheral portion of the crystal. Variations in oxygen concentration in a growth direction were observed. The variations at the central portion show a substantially similar pattern as in the case of the peripheral portion. There exists a phase difference of about 12–20 mm between the variation profile of the central portion and that of the peripheral portion.

This feature reflects the convex profile of the crystal growth interface.

By contrast, in FIG. 11B, oxygen concentration at the central portion of the crystal is substantially similar to that at the peripheral portion of the crystal. Variations in oxygen concentration in a growth direction as observed at the central portion show a good correspondence with those as observed at the peripheral portion. There exists a phase difference of about mere 0–3 mm between the variation profile of the central portion and that of the peripheral portion.

The silicon single crystal of FIG. 11B shows variations in oxygen concentration along a growth direction, but shows a good oxygen concentration distribution in a direction perpendicular to the growth direction. Accordingly, wafers sliced from the silicon single crystal show an excellent in-plane oxygen concentration distribution.

This feature reflects the flat profile of the crystal growth interface.

The present invention is not limited to the above-described embodiments. The above-described embodiments are mere examples, and those having the substantially same structure as that described in the appended claims and providing the similar action and effects are included in the scope of the present invention.

For example, the above embodiments are described while mentioning the growth of silicon single crystals having diameters of 6 and 8 inches. However, the present invention is not limited thereto, but is applicable to the growth of silicon single crystals having diameters of 8–16 inches, or even larger, so long as the pulling rate is adjusted in the N region such that the temperature gradient difference between a central portion and a peripheral section of a crystal in the vicinity of the solid-liquid interface of the crystal is made relatively small.

Also, a magnetic field to be applied to a silicon melt is not limited to a horizontal magnetic filed, but may be a vertical magnetic field, a cusp magnetic field, or the like.

What is claimed is:

1. An apparatus for manufacturing a silicon single crystal according to a Czochralski method, wherein a solid-liquid interface heat insulator is arranged above a silicon melt so as to enclose a silicon single crystal and form a gap of 3–5 cm between the surface of the melt and the bottom end of the solid-liquid interface heat insulator during the growth of a silicon single crystal, so that a furnace temperature is established such that a temperature gradient difference $\Delta G$ (=Ge−Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal.

2. An apparatus for manufacturing a silicon single crystal according to a Czochralski method with a magnetic field applied, wherein a solid-liquid interface heat insulator is arranged above a silicon melt so as to enclose a silicon single crystal and form a gap of 3–5 cm between the surface of the melt and the bottom end of the solid-liquid interface heat insulator during the growth of a silicon single crystal, so that a furnace temperature is established such that a temperature gradient difference $\Delta G$ (=Ge−Gc) is not greater than 5° C./cm, where Ge is a temperature gradient (° C./cm) at a peripheral portion of the crystal, and Gc is a temperature gradient (° C./cm) at a central portion of the crystal, both in an in-crystal descending temperature zone between 1420° C. and 1350° C. or between a melting point of silicon and 1400° C. in the vicinity of the solid-liquid interface of the crystal.

* * * * *